United States Patent [19]

Hsu et al.

[11] Patent Number: 4,662,064
[45] Date of Patent: May 5, 1987

[54] METHOD OF FORMING MULTI-LEVEL METALLIZATION

[75] Inventors: Sheng T. Hsu, West Windsor Township, Mercer County; Doris W. Flatley, Hillsborough Township, Somerset County; Ronald J. Johansson, Lawrence Township, Mercer County, all of N.J.

[73] Assignee: RCA Corporation, Princeton, N.J.

[21] Appl. No.: 762,521

[22] Filed: Aug. 5, 1985

[51] Int. Cl.$^4$ .................................. H01L 21/316
[52] U.S. Cl. ................................ 29/591; 29/590; 156/643; 156/653
[58] Field of Search ............... 29/591, 590, 576 W; 156/643, 646, 651, 653, 654, 657

[56] References Cited

U.S. PATENT DOCUMENTS

| | | | |
|---|---|---|---|
| 3,976,524 | 8/1976 | Feng | 156/651 X |
| 3,985,597 | 10/1976 | Zielinski | 156/643 X |
| 4,307,180 | 12/1981 | Pogge | 430/314 |
| 4,318,751 | 3/1982 | Horng | 148/1.5 |
| 4,377,438 | 3/1983 | Moriya et al. | 156/643 |
| 4,410,622 | 10/1983 | Dalal et al. | 156/659.1 X |
| 4,451,326 | 5/1984 | Gwozdz | 156/643 |
| 4,470,874 | 9/1984 | Bartusa et al. | 156/643 |
| 4,481,070 | 11/1984 | Thomas et al. | 156/643 |
| 4,508,815 | 4/1985 | Ackmann et al. | 156/693 X |
| 4,515,652 | 5/1985 | Gimpelson et al. | 156/643 |
| 4,545,852 | 10/1985 | Barton | 156/643 |

FOREIGN PATENT DOCUMENTS

| | | | |
|---|---|---|---|
| 0050436 | 3/1982 | Japan | 156/643 |
| 0059359 | 4/1982 | Japan | 156/643 |
| 0150648 | 8/1985 | Japan | 29/590 |

OTHER PUBLICATIONS

Adams et al., "Planarization of Phosphorus-Doped Silicon Dioxide" J. Electrochem. Soc., vol. 128, No. 2, 1981 pp. 423-428.
Colclaser, R. D. "Muenoelectronics Processing and Device Design", John Wiley & Son, 1980, pp. 22-49.

*Primary Examiner*—Brian E. Hearn
*Assistant Examiner*—Tuan N. Quach
*Attorney, Agent, or Firm*—Joseph S. Tripoli; Bernard F. Plantz

[57] ABSTRACT

A multi-level metallization is formed by forming a patterned first level metallization layer on the surface of an isolating layer on a substrate of semiconductor material. A thick planarizing layer, preferably of a glass, is applied over the first level metallization layer and the exposed areas of the insulating layer with the planarizing layer bearing depressions in its surface over the exposed areas of the insulating layer. A photoresist layer is formed on the planarizing layer in the depressions in its surface with the portions of the planarizing layer over the first level metallization layer being exposed. The exposed areas of the planarizing layer are isotropically etched until the surface of the planarizing layer is substantially planar with the bottom of the deepest depression in the planarizing layer. Any photoresist material is removed and the planarizing layer is isotropically etched until its surface is substantially planar with the surface of the first level metallization layer. An inter-level insulating layer is applied over the planarized surfaces of the first level metallization layer at the planarizing layer, and a second level metallization layer is applied over the inter-level insulating layer.

8 Claims, 7 Drawing Figures

METHOD OF FORMING MULTI-LEVEL METALLIZATION

The present invention relates to a method of making an integrated circuit having multi-level metallization, and more particularly to a method of making a multi-level metallization in which the surface of the first level is planarized.

BACKGROUND OF THE INVENTION

Integrated circuits include a metallization in the form of a pattern of a conductive material, such as a metal or conductive polycrystalline silicon, extending over and insulated from the surface of the semiconductor substrate of the integrated circuit. The metallization extends through openings in the insulation between the metallization and the substrate surface and makes ohmic contact with the substrate to electrically connect the various components of the integrated circuit. As the number of components in integrated circuits has increased, it was found that a single level of the metallization could not connect all of the components. Therefore, it became necessary to use multiple levels of metallization with a layer of insulating material between adjacent levels.

A problem that has been found in making multi-level metallization arises from the fact that the conductive layer forming the first level has a thickness which causes it to project above the surface of the insulating layer on which it is formed. When the interlevel insulating layer is coated over the first level, it forms a hump or projection which extends over a portion of the first level. When applying the second level of the metallization, problems arise in obtaining complete and unbroken coverage of the second level over the humps formed by the first level, particularly where the humps have steep, sharp sides. One method of overcoming this problem is to form the humps with sides which are not steep, i.e., have a small angle with respect to the planar surface so that the surface over which the second level extends is smoother. However, a better method of overcoming this problem is to planarize the first level by depositing a layer of an insulating material to fill the space between the first level metal deposits and thus form a surface planar with the surface of the first level metallization. This completely eliminates any humps in the inter-level insulating layer and the second level of the metallization is formed over a planar surface.

SUMMARY OF THE INVENTION

A method of forming multi-level metallization on a semiconductor substrate includes the steps of forming a patterned first layer of a conductive material on a layer of insulating material which is over the substrate surface. A planarizing layer of insulating material is provided over the first conductive layer and any exposed portion of the insulating layer. This planarizing layer is thicker than the first conductive layer and has depressions in its surface over the exposed portions of the insulating layer between the pattern of the conductive layer. A layer of a resist material is formed on the planarizing layer over the depressions in the planarizing layer leaving exposed the portions of planarizing layer over the first conductive layer. The exposed portions of the planarizing layer are etched so that the surface of the planarizing layer is substantially planar with the portion of the planarizing layer at the bottom of the deepest depression. Any of the resist layer is then removed from the planarizing layer and the planarizing layer is then etched until its surface is substantially planar with the surface of the first conductive layer.

DETAILED DESCRIPTION OF PREFERRED EMBODIMENT

Figure 1:
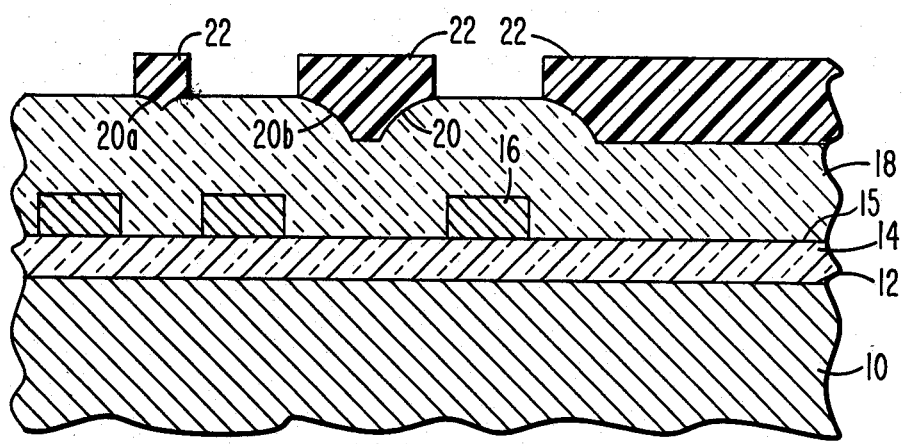
FIGS. 1–4 are sectional views of an integrated circuit illustrating in sequence the steps of the method of the present invention.

Referring initially to FIG. 1, to perform the method of the present invention a substrate 10 of semiconductor material, such as single crystalline silicon, having various components (not shown) formed therein along a major surface 12 is provided with a layer 14 of an insulating material, such as silicon oxide, on its surface 12. A first level of metallization 16 is then formed on the insulating layer 14. The first level of metallization 16 can be formed by applying a layer of a conductive material, such as a metal or conductive polycrystalline silicon, over the entire surface 15 of the insulating layer 14. A metal layer may be coated on the insulating layer 14 for example by evaporation in a vacuum or by sputtering. A polycrystalline silicon layer can be deposited on the insulating layer 14 by chemical vapor deposition from silane. The conductive layer is then coated with a layer of a positive photoresist and a mask having opaque areas of the shape and position corresponding to the desired pattern of the first level of metallization 16 is placed over the photoresist layer. Light is then directed through the mask to expose the portions of the photoresist layer not covered by the opaque portions of the mask. The exposed portions of the photoresist layer are then developed and removed leaving the photoresist layer only over the portions of the conductive layer which are to form the first level of metallization 16. The exposed portions of the conductive layer are then removed with a suitable etchant leaving the first level of metallization 16.

As shown in FIG. 1, a planarizing layer 18 is then coated over the first level of metallization 16 and the exposed areas of the insulating layer 14. The planarizing layer 18 is of an insulating material, preferably lightly doped silicon oxide such as phosphorus silica glass or boron phosphorus silica glass. The planarizing layer 18 can be applied by the chemical vapor deposition technique described in the U.S. Pat. of W. Kern No. 3,481,781 issued Dec. 2, 1969, entitled "Glass Coating of Semiconductor Devices." The thickness of the planarizing layer 18 is approximately equal to two times the thickness of the first level of metallization 16. The planarizing layer 18 will have depressions 20 in its surface over the areas of the insulating layer 14 between the portions of the first level of metallization 16. The size and depth of the depressions 20 will vary with the spacing between the adjacent portions of the first level of metallization 16. The depression 20a between closely spaced portions of the first level of metallization 16 is narrow and shallow whereas the depression 20b between more widely spaced portions of the first level of metallization 16 is wider and deeper.

A layer 22 of a photoresist is then formed on the planarizing layer 18 in each of the depressions 20 with each region of the photoresist being of a width slightly less than the spacing between the adjacent portions of the first level of metallization 16 which forms the depressions 20. This can be achieved by applying a layer of a positive photoresist across the entire surface of the planarizing layer 18. A mask which is the reverse of the mask used to form the first level of metallization 16 is placed over the photoresist layer 22 so that the opaque areas of the mask are over the spaces between the portions of the first level of metallization 16. Light is directed through the mask to expose the portions of the photoresist layer 22 over the first level of metallization 16 and the exposed portions of the photoresist layer 22 are developed to remove them and leave the photoresist layer 22 only over the areas between the portions of the first level of metallization 16. Alternatively, a mask substantially the same as the mask used for forming the first level of metallization 16 can be used with a negative photoresist layer 22 so that the portions of the photoresist layer 22 which are exposed to the light are maintained and the non-exposed portions are removed.

Figure 2:
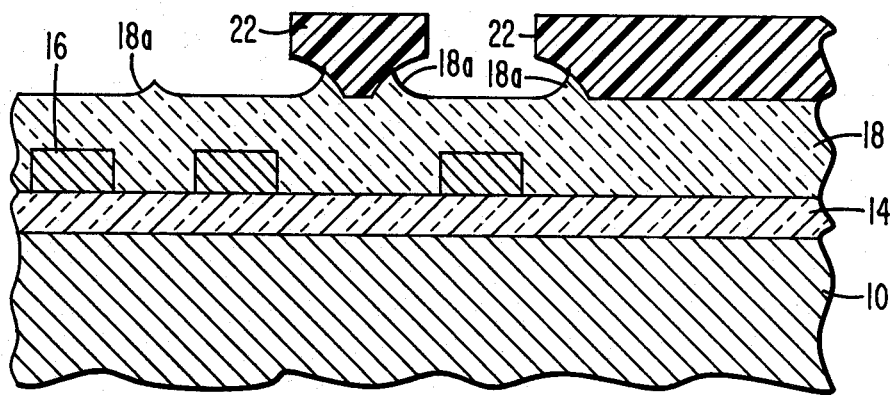

The exposed portions of the planarizing layer 18 are then isotropically etched either with a plasma etch or a wet chemical (buffered hydrofluoric acid) etch process. An isotropic etch etches the material of the planarizing layer 18 at the same rate in all directions, i.e., laterally with respect to the surface of the planarizing layer 18 as well as normal to its surface. The planarizing layer 18 is etched until its surface is substantially planar with the surface of the deepest recess 20 as shown in FIG. 2. The thickness of the planarizing layer 18 at the bottom of the deepest recess 20 is greater than the thickness of the first level of metallization 16 so that the planarizing layer 18 will still extend continuously over the first level of metallization 16. Since the planarizing layer 18 will be etched from both sides of the various portions of the photoresist layer 22, it may be etched out completely from some of the more narrow portions of the photoresist layer 22 which will drop from the planarizing layer 18. Any remaining portions of the photoresist layer 22 are then removed with a suitable solvent.

Figure 3:
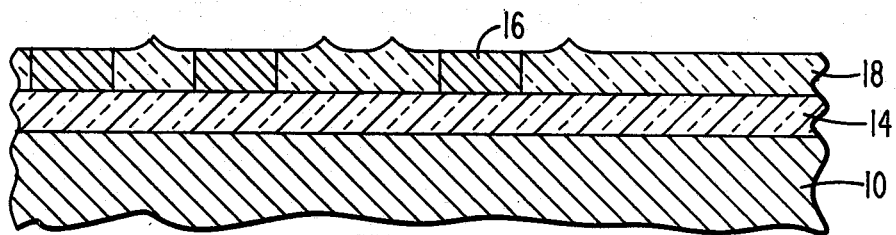

Although the surface of the planarizing layer 18 is substantially planar, as shown in FIG. 2, it will have slight projections 18a over the spaces between the portions of the first level of metallization 16. The planarizing layer 18 is again isotropically etched until the surface of the planarizing layer 18 is substantially planar with the surface of the first level of metallization 16 as shown in FIG. 3. Although the planarizing layer 18 will still have slight projections in its surface, the projections will be smaller than they were after the first etching step.

Figure 4:
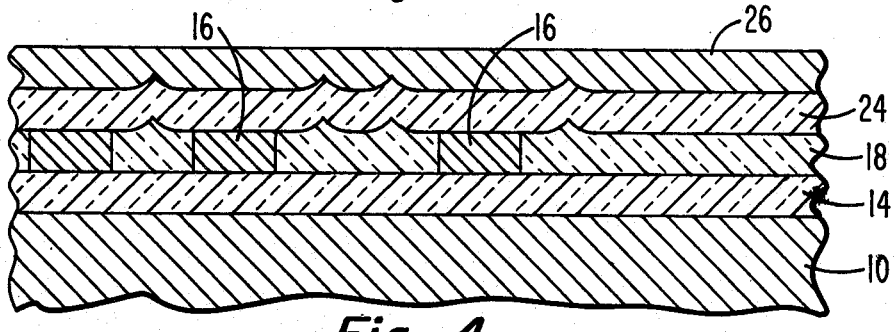

As shown in FIG. 4, an inter-level dielectric layer 24 is then applied over the first level of metallization 16 and the planarizing layer 18. The inter-level dielectric 24 can be either deposited silicon oxide, phosphorus silica glass, boron phosphorus silica glass or a plastic, such as a polyimide. The inter-level dielectric layer 24 can be provided with a smoother surface by making it thicker than desired and then etching back to the desired thickness. The second level of metallization 26 is then formed over the inter-level dielectric layer 24.

Figure 5:
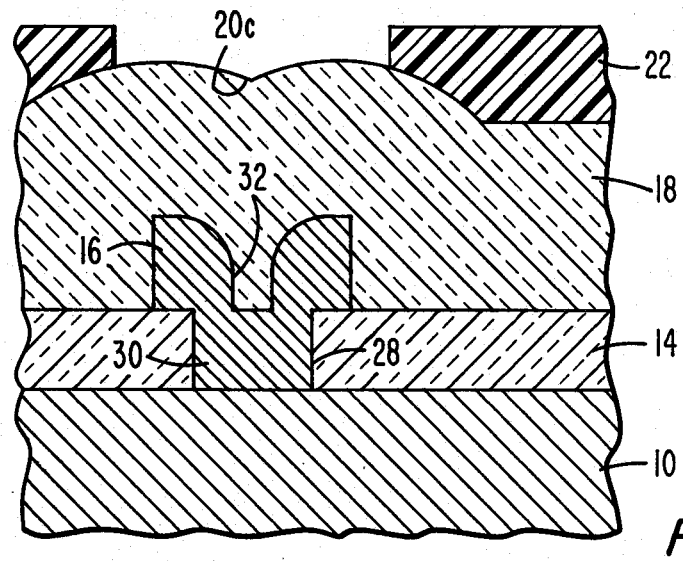
FIGS. 5–7 are sectional views illustrating the method steps of the present invention over a contact.
Figure 6:
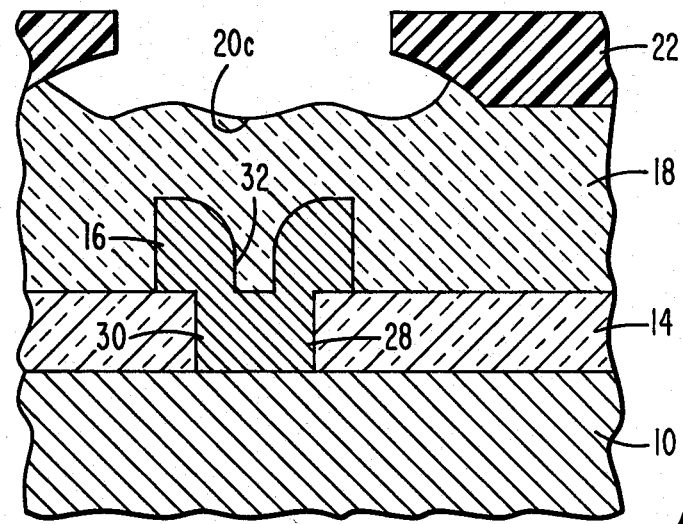
Figure 7:
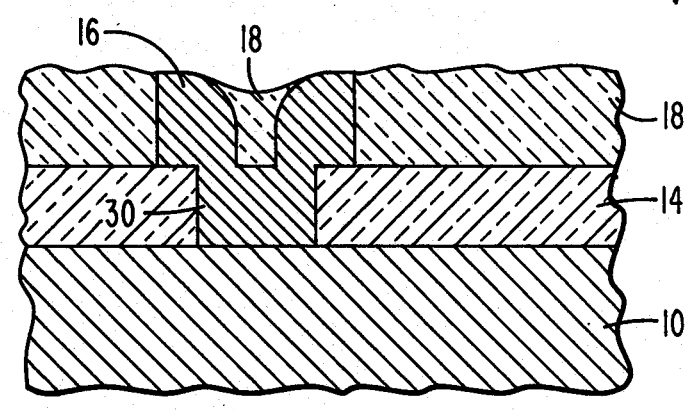

As shown in FIG. 5, the insulating layer 14 has openings 28 therethrough through which the first level of metallization 16 extends to form contacts 30 which are in ohmic contact to the substrate 10. This provides the electrical connection to the various components formed in the substrate 10. When the first level of metallization 16 is evaporated or sputtered onto the insulating layer 14 and within the contact openings 28, it will have a recess 32 in its surface over the contact 30. When the planarizing layer 18 is applied over the first level of metallization 16, it will have a slight depression 20c in its surface over the recess 32 in the first level of metallization 16. When the planarizing layer 18 is first etched to the level of the bottom of the depressions 20, the slight depression 20c will remain as shown in FIG. 6. When the planarizing layer 18 is finally etched to the surface of the first level of metallization 16 as shown in FIG. 7, the material of the planarizing layer 18 will fill the recess 32 but will have a slightly depressed surface. However, this slight depression 20c does not adversely affect the inter-level dielectric 24 or the second level of metallization 26.

Thus, there is provided by the present invention a method of planarizing the first level of metallization of a multi-level metallization so that there is provided a relatively smooth surface over which the inter-level dielectric and second level of metallization can be easily applied. Although the method of the present invention has been described with regard to planarizing the first level of metallization of a multi-level metallization, if there are more than two levels the second level and any other additional level of the metallization can be planarized by the same method prior to applying an inter-level dielectric and an additional level of metallization.

We claim:

1. In a method of forming multi-level metallization on a semiconductor substrate, the steps of:
    (a) forming a patterned first layer of a conductive material on a layer of insulating material which is over a surface of the substrate,
    (b) providing a planarizing layer of insulating material over the first conductive layer and any exposed portion of the insulating layer, said planarizing layer being twice the thickness of the first conductive layer and having depressions in its surface over the said exposed portions of the insulating layer,
    (c) forming a layer of a resist material on the planarizing layer over the depressions in the planarizing layer leaving exposed the portions of the planarizing layer over the first conductive layer,
    (d) etching the exposed portions of the planarizing layer so that the surface of the planarizing layer is substantially planar with the portions of the planarizing layer at the bottom of the deepest depression,
    (e) removing any of the resist layer on the planarizing layer, and then
    (f) etching the entire surface of the planarizing layer until it is substantially planar with the surface of the first conductive layer.

2. A method in accordance with claim 1 wherein the planarizing layer is etched by an isotropic etch.

3. A method in accordance with claim 2 wherein the thickness of the planarizing layer at the bottom of the deepest depression is thicker than the thickness of the first conductive layer.

4. A method in accordance with claim 3 wherein the planarizing layer is a doped glass.

5. A method in accordance with claim, 2 wherein the patterned first conductive layer is formed by
    applying a layer of the conductive material over the surface of the insulating layer,
    applying a photoresist layer on the conductive layer,
    exposing the photoresist layer using a mask having opaque and transparent areas one of which corresponds to the pattern desired for the conductive layer, developing the photoresist layer to expose portions of the conductive layer, and removing the undesired portions of the conductive layer.

6. A method in accordance with claim 5 wherein the photoresist over the planarizing layer is formed by applying a layer of photoresist material over the entire surface of the planarizing layer, exposing the photoresist layer using a mask which is the reverse of the mask used to form the patterned first conductive layer, and then developing the photoresist layer to leave the portions in the depressions.

7. A method in accordance with claim 5 wherein the photoresist over the planarizing layer is formed by applying a layer of a photoresist material of the opposite type to that used to pattern the first conductive layer over the entire surface of the planarizing layer, used a mask substantially the same as that used to pattern the first conductive layer, exposing the photoresist layer, and then developing the photoresist layer to leave portions in the depressions.

8. A method in accordance with claim 1 including the additional step of applying an inter-level insulating layer over the planarize surfaces of the first conductive layer and the planarizing layer, and forming a second conductive layer over the inter-level insulating layer.

* * * * *